United States Patent
Shi et al.

(10) Patent No.: US 11,959,938 B2
(45) Date of Patent: Apr. 16, 2024

(54) PACKAGE SUBSTRATE, APPARATUS FOR TESTING POWER SUPPLY NOISE AND METHOD FOR TESTING POWER SUPPLY NOISE

(71) Applicant: CHANGXIN MEMORY TECHNOLOGIES, INC., Hefei (CN)

(72) Inventors: Honglong Shi, Hefei (CN); Maosong Ma, Hefei (CN); Jianbin Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 50 days.

(21) Appl. No.: 17/951,625

(22) Filed: Sep. 23, 2022

(65) Prior Publication Data
US 2023/0384347 A1    Nov. 30, 2023

Related U.S. Application Data

(63) Continuation of application No. PCT/CN2022/097546, filed on Jun. 8, 2022.

(30) Foreign Application Priority Data

May 25, 2022  (CN) .......................... 202210580267.7

(51) Int. Cl.
*G01R 1/04*       (2006.01)
*G01R 31/40*     (2020.01)

(52) U.S. Cl.
CPC ........... *G01R 1/0416* (2013.01); *G01R 31/40* (2013.01)

(58) Field of Classification Search
CPC .............................. G01R 1/0416; G01R 31/40
USPC .................................... 324/764.01, 537, 500
See application file for complete search history.

(56) References Cited

U.S. PATENT DOCUMENTS

| | | | |
|---|---|---|---|
| 11,415,308 B1 * | 8/2022 | Haney | F21V 23/06 |
| 2020/0397930 A1 * | 12/2020 | Motley | G06N 3/084 |
| 2022/0408561 A1 * | 12/2022 | Savariego | H05K 1/111 |

FOREIGN PATENT DOCUMENTS

CN    107426916 A    12/2017

* cited by examiner

*Primary Examiner* — Giovanni Astacio-Oquendo
(74) *Attorney, Agent, or Firm* — Ladas & Parry LLP

(57) ABSTRACT

A package substrate, an apparatus for testing power supply noise, and a method for testing power supply noise are provided. The package substrate includes multiple pad arrays, and each of the multiple pad arrays at least includes power supply pads. Power supply pads belonging to a same power supply type in the multiple pad arrays are divided into a test pad and a power supply pad set. The power supply pad set includes power supply pads, other than the test pad, among the power supply pads belonging to the same power supply type, all the power supply pads in the power supply pad set are electrically connected together, and the test pad is configured to perform noise testing of at least one internal power supply corresponding to the same power supply type in a chip to be tested.

20 Claims, 10 Drawing Sheets

In a testing mode, noise testing of at least one internal power supply corresponding to a first power supply type in a chip to be tested is performed through a first test point on a test board, here, the first test point has a corresponding relationship with the first power supply type, and the first power supply type is any one of a VDD1 power supply type, a VDD2 power supply type, and a VDDQ power supply type ⸺ S1001

FIG. 10

PACKAGE SUBSTRATE, APPARATUS FOR TESTING POWER SUPPLY NOISE AND METHOD FOR TESTING POWER SUPPLY NOISE

CROSS-REFERENCE TO RELATED APPLICATION

The present application is a continuation of International Patent Application No. PCT/CN2022/097546 filed on Jun. 8, 2022, which is based upon and claims priority to Chinese patent application No. 202210580267.7 filed on May 25, 2022. The entire contents of both applications are hereby incorporated by reference in their entirety.

BACKGROUND

With the continuous development of semiconductor technologies, people have put forward higher and higher requirements for transmission speed of data when manufacturing and using apparatuses such as computers. In order to obtain faster data transmission speed, a series of devices such as memory over which data can be transmitted at double data rate (DDR) have emerged.

SUMMARY

The present disclosure relates to the field of semiconductor technologies, and provides a package substrate, an apparatus for testing power supply noise and a method for testing power supply noise.

In a first aspect, an embodiment of the present disclosure provides a package substrate. The package substrate includes multiple pad arrays, and each of the multiple pad arrays at least includes power supply pads.

Power supply pads belonging to a same power supply type in the multiple pad arrays are divided into a test pad and a power supply pad set. The power supply pad set includes power supply pads, other than the test pad, among the power supply pads belonging to the same power supply type, all the power supply pads in the power supply pad set are electrically connected together, and the test pad is configured to perform noise testing of at least one internal power supply corresponding to the same power supply type in a chip to be tested.

In a second aspect, an embodiment of the present disclosure provides an apparatus for testing power supply noise. The apparatus for testing power supply noise includes the package substrate as described in the first aspect, the chip to be tested and a test board.

The test board is disposed with a first test point corresponding to a first power supply type.

The chip to be tested at least includes power supply pins corresponding to the first power supply type, and the power supply pins are divided into a first test pin and a first power supply pin set excluding the first test pin.

The package substrate at least includes power supply pads corresponding to the first power supply type, and the power supply pads are divided into a first test pad and a first power supply pad set excluding the first test pad.

Each of power supply pins in the first power supply pin set is electrically connected to a respective one of power supply pads in the first power supply pad set, the first test pin is electrically connected to the first test pad, and the first test pad is further electrically connected to the first test point, so that the first test point is capable of performing, through the first test pad and the first test pin, noise testing of at least one internal power supply corresponding to the first power supply type in the chip to be tested.

In a third aspect, an embodiment of the present disclosure provides a method for testing power supply noise, which is applied to the apparatus for testing power supply noise described in the second aspect. The method includes following operations.

In a testing mode, noise testing of the at least one internal power supply corresponding to the first power supply type in the chip to be tested is performed through the first test point on the test board. The first test point has a corresponding relationship with the first power supply type, and the first power supply type is any one of a VDD1 power supply type, a VDD2 power supply type, and a VDDQ power supply type.

BRIEF DESCRIPTION OF THE DRAWINGS

FIG. 10 is a flowchart of a method for testing power supply noise according to an embodiment of the present disclosure.

DETAILED DESCRIPTION

Figure 1:
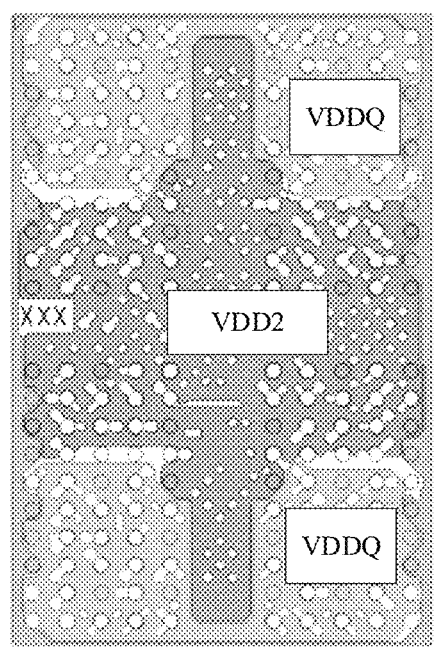
FIG. 1 is a diagram of a layout of a package substrate.

Technical solutions in the embodiments of the present disclosure will be clearly and completely described below with reference to the accompanying drawings in the embodiments of the present disclosure. It should be understood that the specific embodiments described herein are only used to explain the present disclosure, but not to limit the present disclosure. In addition, it should be noted that for the convenience of description, only the parts related to the present disclosure are illustrated in the drawings.

Unless otherwise defined, all technical and scientific terms used herein have the same meaning as commonly understood by one of ordinary skill in the art to which the present disclosure belongs. The terms used herein are for the purpose of describing the embodiments of the present disclosure only and are not intended to limit the present disclosure.

In the following description, the mentioned "some embodiments" describes a subset of all possible embodiments. It is understood that "some embodiments" can be the same subset or different subsets of all possible embodiments, and can be combined with each other without conflict.

It should be noted that the term "first\second\third" involved in the embodiments of the present disclosure is only used to distinguish similar objects, but does not represent a specific ordering of the objects. It can be understood that the specific order or sequence of "first\second\third" can be interchanged when being permitted, so as to enable the embodiments of the disclosure described herein to be practiced in sequences other than those illustrated or described herein.

It can be understood that taking a synchronous dynamic random access memory (SDRAM) as an example, during an operation of a SDRAM chip, power supply signals are generally required to be tested to verify power supply integrity.

In some embodiments, the power supply signals can be led out through a SDRAM signal test board for testing. Alternatively, power supply test points can be added to a system mainboard to test the power supply signals. However, in a design of a package substrate of the SDRAM chip, pins corresponding to the same power supply signal are all connected together, so that power supply noise in the chip cannot be accurately measured during the testing of the power supply signals.

For the SDRAM chip, the SDRAM chip at least includes three types of power supply signals, such as a VDD1 power supply type, a VDD2 power supply type and a VDDQ power supply type, and each power supply type can correspond to multiple power supply pins. Specifically, the SDRAM chip can be disposed with multiple VDD1 power supply pins, multiple VDD2 power supply pins and multiple VDDQ power supply pins. Each of the multiple VDD1 power supply pins is electrically connected to a respective one of VDD1 power supply pads on a package substrate, each of the multiple VDD2 power supply pins is electrically connected to a respective one of VDD2 power supply pads on the package substrate, and each of the multiple VDDQ power supply pins is electrically connected to a respective one of VDDQ power supply pads on the package substrate.

Exemplarily, referring to FIG. 1, FIG. 1 is a schematic diagram of a layout of a package substrate. As illustrated in FIG. 1, the package substrate includes two types of power supply pads, i.e., VDD2 power supply pad(s) and VDDQ power supply pad(s). All VDD2 power supply pads belonging to the VDD2 power supply type are connected together to form a VDD2 power supply network, and all VDDQ power supply pads belonging to the VDDQ power supply type are connected together to form a VDDQ power supply network. Since all the VDD2 power supply pads belonging to the VDD2 power supply type are connected together, all the power supply pins corresponding to the VDD2 power supply type in the chip are connected together. Since all the VDDQ power supply pads belonging to the VDDQ power supply type are connected together, all the power supply pins corresponding to the VDDQ power supply type in the chip are connected together. Similarly, for VDD1 power supply pads (not illustrated in the figure) belonging to the VDD1 power supply type, all the VDD1 power supply pads will be connected together on the package substrate, so that all power supply pins corresponding to the VDD1 power supply type in the chip are connected together.

Figure 2:
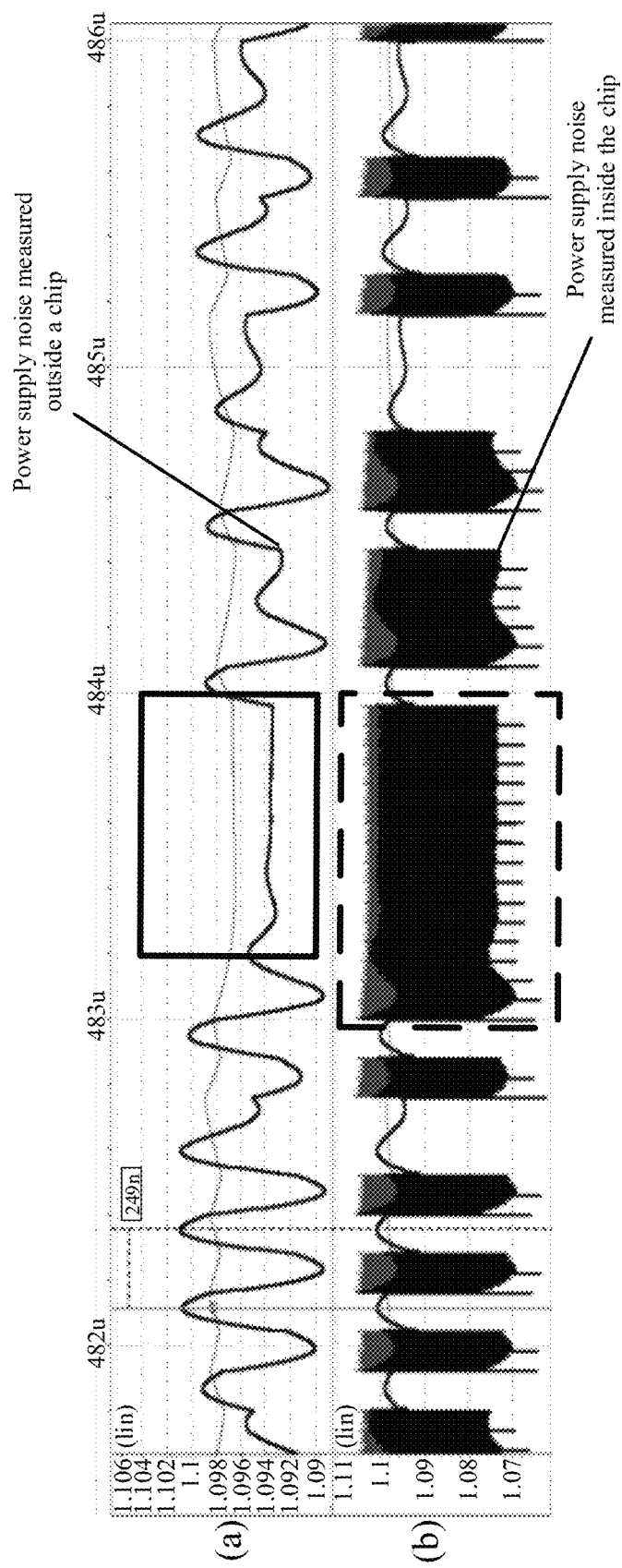
FIG. 2 is a diagram of test results of chip power supply noise.

Based on the package substrate of FIG. 1, FIG. 2 is a schematic diagram of test results of chip power supply noise. As illustrated in FIG. 2, (a) is a power supply noise test result inside the chip, and (b) is a power supply noise test result outside the chip. The power supply noise test result inside the chip means power supply noise actually measured inside the chip, and the power supply noise test result outside the chip means power supply noise measured outside the chip in a conventional manner. In FIG. 2, for (a), the test result in a bold solid line box reflects that the power supply noise in the chip is very serious, but in the corresponding time period in (b), almost no power supply noise is measured outside the chip, which is reflected by the test result in a bold dashed box.

That is to say, the VDD1 power supply pads are connected together on the package substrate, the VDD2 power supply pads are connected together on the package substrate, and the VDDQ power supply pads are connected together on the package substrate. That is, the power supply pins corresponding to the same power supply signal are all connected together. It can be seen that the testing of power supply noise cannot be distinguished, and the overall noise of a type of power supply signal is tested outside the chip, so that the noise measured outside the chip in the conventional way cannot correctly reflects the actual noise in the chip. As a result, the accurate situation of the power supply noise in the chip cannot be directly measured when testing the power supply.

Based on this, the embodiments of the present disclosure further provide a package substrate. The package substrate includes multiple pad arrays, and each of the multiple pad arrays at least includes power supply pads. Power supply pads belonging to a same power supply type in the multiple pad arrays are divided into a test pad and a power supply pad set. The power supply pad set includes power supply pads, other than the test pad, among the power supply pads belonging to the same power supply type, and all the power supply pads in the power supply pad set are electrically connected together. The test pad is configured to perform noise testing of at least one internal power supply corresponding to the same power supply type in a chip to be tested. Embodiments of the present disclosure further provide an apparatus for testing power supply noise and a method for testing power supply noise. The method for testing power supply noise is applied to the apparatus for testing power supply noise. The apparatus for testing power supply noise includes the package substrate, the chip to be tested, and a test board. The test board is disposed with a first test point corresponding to a first power supply type. The chip to be tested at least includes power supply pins corresponding to the first power supply type, and the power supply pins are divided into a first test pin and a first power supply pin set excluding the first test pin. The package substrate at least includes power supply pads corresponding to the first power supply type, and the power supply pads are divided into a first test pad and a first power supply pad set excluding the first test pad. Each of power supply pins in the first power supply pin set is electrically connected to a respective one of power supply pads in the first power supply pad set, and the first test pin is electrically connected to the first test pad, and the first test pad is further electrically connected to the first test point, so that the first test point is capable of performing, through the first test pad and the first test pin, noise testing of at least one internal power supply corresponding to the first power supply type in the chip to be tested.

In this way, based on the apparatus for testing power supply noise, a pin is separated from other pins on a package substrate and is taken as a first test pin, a first test point is disposed on a test board, and the first test pin is connected to the first test point, so that not only a signal for testing power supply noise is led out through the first test point, but also the signal for testing is independent of a first power supply network corresponding to a first power supply type. Thus, noise testing of at least one internal power supply in the chip to be tested is performed through the first test point on the test board, which improves accuracy of testing the power supply noise.

The embodiments of the present disclosure will be described in detail below with reference to the accompanying drawings.

Figure 3:
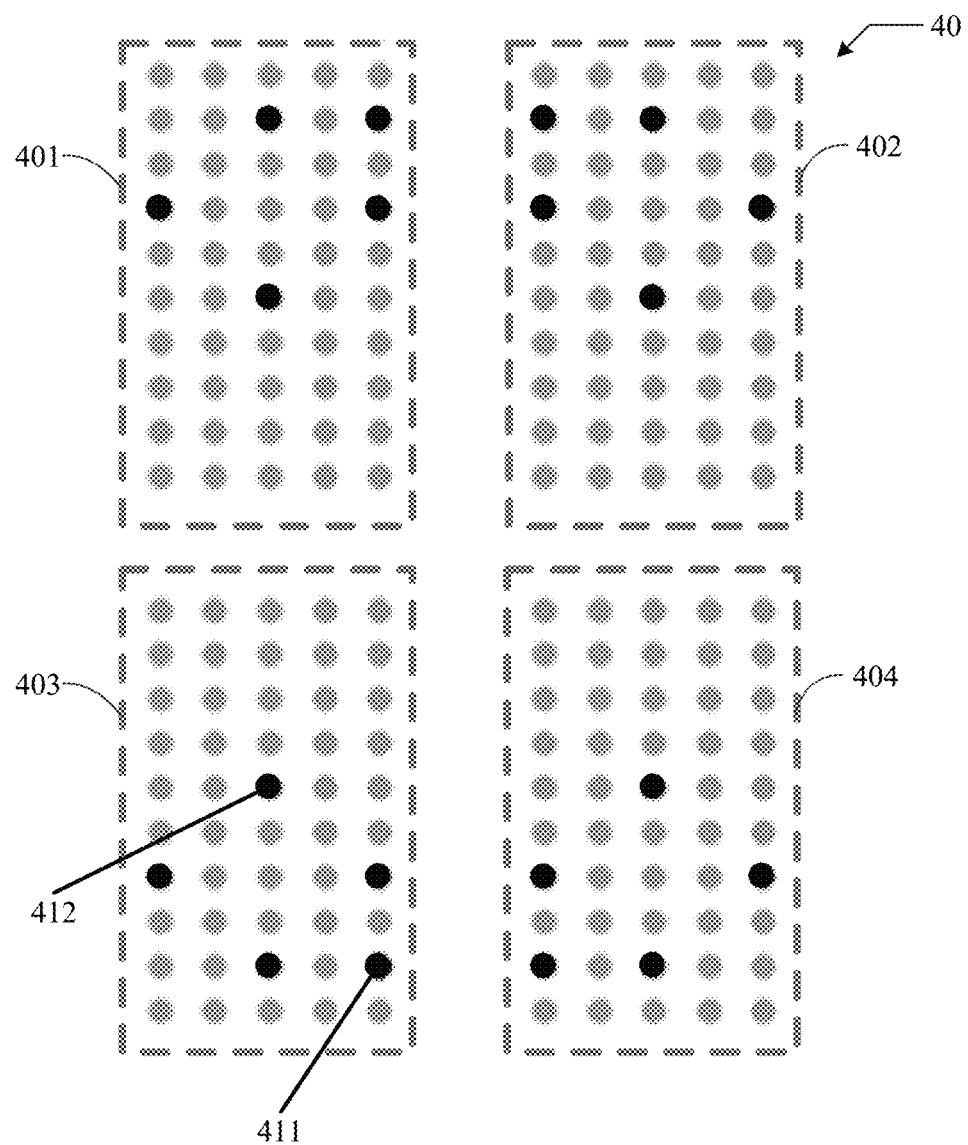
FIG. 3 is a diagram of a composition structure of a package substrate according to an embodiment of the present disclosure.

In an embodiment of the present disclosure, referring to FIG. 3, FIG. 3 is a diagram of a composition structure of a package substrate according to an embodiment of the present disclosure. As illustrated in FIG. 3, the package substrate 40 includes multiple pad arrays (e.g., a pad array 401, a pad array 402, a pad array 403, and a pad array 404), and each of the multiple pad arrays at least includes power supply pads.

Power supply pads belonging to a same power supply type in the multiple pad arrays are divided into a test pad 411 and a power supply pad set. The power supply pad set includes power supply pads 412, other than the test pad 411, among the power supply pads belonging to the same power supply type, and all the power supply pads in the power supply pad set are electrically connected together.

The test pad 411 is configured to perform noise testing of at least one internal power supply corresponding to the same power supply type in the chip to be tested.

It should be noted that in the embodiment of the present disclosure, the package substrate (SUB for short) can provide electric connection, protection, support, heat dissipation, assembly and other functions for the chip to be tested, so as to realize the multi-pin, reduce the volume of packaged product, improve electrical performance and heat dissipation, and realize ultra-high density or multi-chip modularization. In the present disclosure, the package substrate is a carrier of a semiconductor chip package. The cut wafers (i.e., Dies) are fixed on the package substrate, and ultra-fine metal wires or conductive resins are utilized to electrically connect the Dies to pads on the package substrate.

It should also be noted that in the embodiment of the present disclosure, the chip to be tested may be a wafer, which is represented by 'Die'. The internal power supplies in the Die include power supplies of multiple power supply types, such as a VDD1 power supply type, a VDD2 power supply type, and a VDDQ power supply type. In the present disclosure, a VDDQ can be regarded as a power supply for an input/output buffer (IO Buffer) circuit; and each of a VDD1 and a VDD2 can be regarded as a power supply for a chip core, but voltages of the VDD1 and the VDD2 are different. In this way, according to the embodiment of the present disclosure, performing noise testing of at least one internal power supply in the chip to be tested may be performing noise testing of at least one internal power supply corresponding to the VDD1 power supply type, or performing noise testing of at least one internal power supply corresponding to the VDD2 power supply type, or performing noise testing of at least one internal power supply corresponding to the VDDQ power supply type, which is not limited herein.

Exemplarily, as illustrated in FIG. 3, taking the VDDQ power supply type as an example, there are 20 power supply pads belonging to the VDDQ power supply type (which is marked with black filling). For the 20 power supply pads, one of the 20 power supply pads is selected as the test pad 411. The remaining 19 power supply pads (e.g., 412) form the power supply pad set corresponding to the VDDQ power supply type, and all the power supply pads in the power supply pad set are electrically connected together.

That is to say, in the embodiment of the present disclosure, there are multiple power supply pads belonging to the same power supply type, and not all of the multiple power supply pads are electrically connected together. Specifically, one of the multiple power supply pads belonging to the same power supply type is separated from other power supply pads and taken as the test pad, and then all other power supply pads are electrically connected together. In this way, noise testing of at least one internal power supply in the chip to be tested is performed by using the separate test pad, so that the power supply noise in the chip can be accurately measured.

In some embodiments, the package substrate 40 includes four pad arrays. The four pad arrays form an up-down symmetrical and left-right symmetrical structure.

It should also be noted that in the embodiment of the present disclosure, referring to FIG. 3, the package substrate 40 includes the pad array 401, the pad array 402, the pad array 403 and the pad array 404. The four pad arrays may have a left-right symmetrical structure along a horizontal direction and an up-down symmetrical structure along a vertical direction. In this way, in a design of the package substrate 40, these pad arrays are distributed symmetrically, and thus the overall aesthetics is good.

Figure 4:
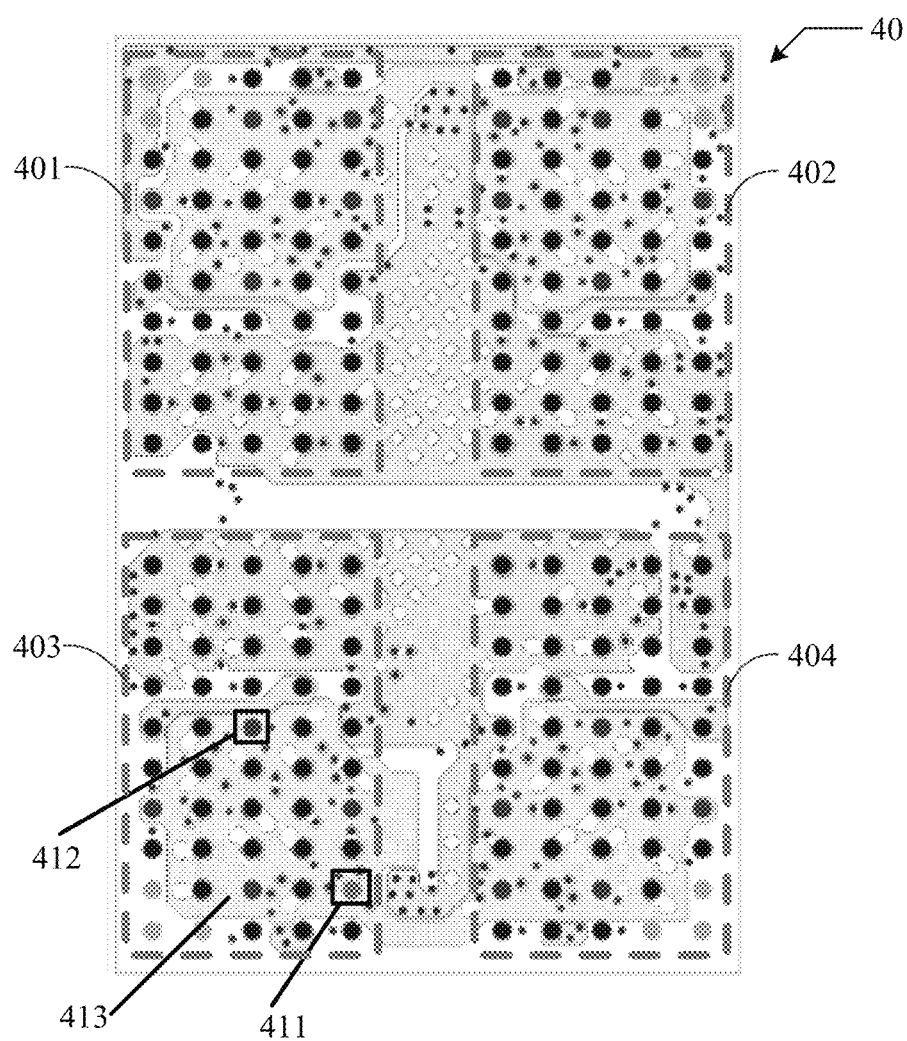
FIG. 4 is a diagram of a composition structure of another package substrate according to an embodiment of the present disclosure.

In some embodiments, based on the package substrate 40 illustrated in FIG. 3, referring to FIG. 4, the package substrate 40 further includes a conductive layer 413. In the conductive layer 413, the power supply pads in the power supply pad set are electrically connected by means of copper laying to form a first power supply network, and the test pad 411 is independent of the first power supply network.

It should be noted that in the embodiment of the present disclosure, the package substrate 40 is a multi-layer board, each layer of which may serve as a conductive layer. Exemplarily, for three power supply types, such as the VDD1 power supply type, the VDD2 power supply type, and the VDDQ power supply type, different layers may be used to achieve electrical connection of power supply pads corresponding to the same power supply type among different power supply types, and also achieve the large-area copper laying for the same power supply type, thereby improving the overcurrent capability, reducing the impedance of the power supply, effectively suppressing the crosstalk between the signals, and further facilitating heat dissipation. For example, for the multi-layer conductive layers of the package substrate, FIG. 1 can be regarded as one conductive layer, and FIG. 4 can be regarded as another conductive layer.

It should also be noted that in the embodiment of the present disclosure, as illustrated in FIG. 4, taking the VDDQ power supply type as an example, in a testing mode for VDDQ power supply noise, except the test pad 411, all the remaining power supply pads are electrically connected together to form a VDDQ power supply network. The test pad 411 is not connected to the VDDQ power supply network, so as to facilitate subsequent noise testing of the VDDQ power supply by using the test pad 411.

Further, in some embodiments, a surface of the package substrate 40 is disposed with a gold finger. In the same power supply type, a distance between the test pad and the gold finger is less than a distance between each of the power supply pads in the power supply pad set and the gold finger.

It should be noted that in the embodiment of the present disclosure, the separate test pad may be any one of the power supply pads belonging to the same power supply type. In a specific implementation, in the same power supply type, the selected test pad needs to be as close to the gold finger on the package substrate 40 as possible, so that wiring is as short as possible and a wiring loop is as small as possible.

Figure 5:
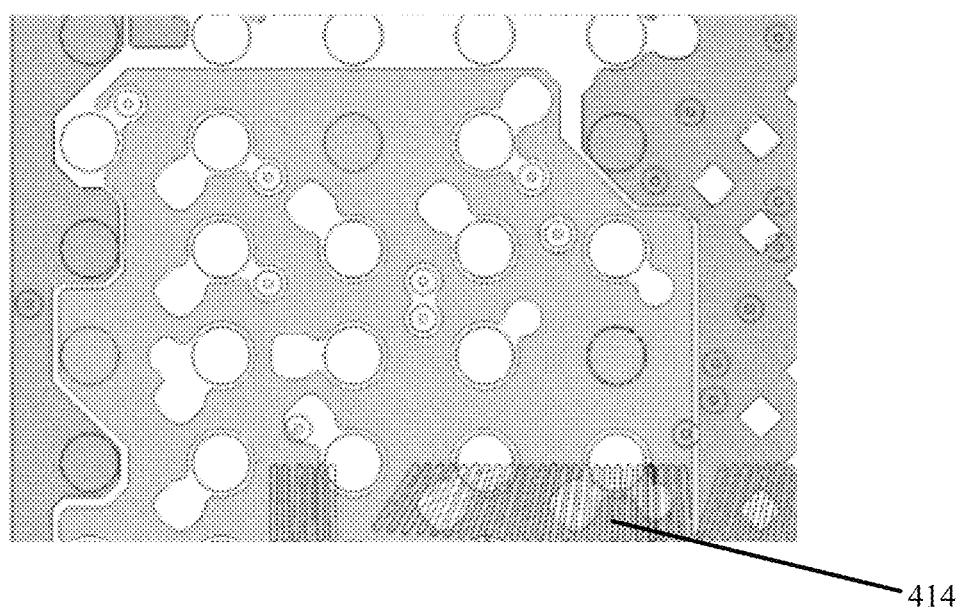
FIG. 5 is a partially enlarged diagram of a package substrate according to an embodiment of the present disclosure.

For example, referring to FIG. 5, FIG. 5 is a partially enlarged diagram of a package substrate according to an embodiment of the present disclosure. In FIG. 5, the disposition of the gold finger 414 on the package substrate is schematically illustrated. In this way, in the same power supply type, when selecting a test pad, a distance between the finally selected test pad and the gold finger needs to be less than a distance between each of other power supply pads and the gold finger.

Further, in some embodiments, the surface of the package substrate 40 is further provided with the chip to be tested (not illustrated in the figure). The chip to be tested includes multiple pin arrays, and each of the multiple pin arrays at least includes power supply pins.

Power supply pins belonging to a same power supply type in the multiple pin arrays are divided into a test pin and a power supply pin set. Each of power supply pins in the power supply pin set is electrically connected to a respective one of the power supply pads in the power supply pad set, and the test pin is electrically connected to the test pad, so that the test pad is capable of performing, through the test pin, the noise teasing of the at least one internal power supply corresponding to the same power supply type in the chip to be tested.

It should be noted that in the embodiment of the present disclosure, for the same power supply type, the power supply pads on the package substrate need to be divided to separate one power supply pad from other power supply pads and use the separate power supply pad as the test pad, and then connect all other power supply pads together; and correspondingly, the power supply pins of the chip to be tested also need to be divided to separate one power supply pin from other power supply pins and use the separate power supply pin as the test pin, so that the test pad is capable of performing, through the test pin, noise teasing of at least one internal power supply corresponding to the same power supply type in the chip to be tested.

It should also be noted that in the embodiment of the present disclosure, there are correspondences between the multiple pin arrays of the chip to be tested and the multiple pad arrays of the package substrate, and each pin is connected to a respective pad on the package substrate. In the present disclosure, for the chip to be tested, the multiple pin arrays have a left-right symmetrical structure along the horizontal direction and an up-down symmetrical structure along the vertical direction.

Exemplarily, still taking the same power supply type as an example, after the test pin is separated from other power supply pins, the test pin is electrically connected to the test pad, and other power supply pins are electrically connected to the power supply pads in the power supply pad set in one-to-one correspondences, so that all other power supply pins are electrically connected together. The separate test pin is connected to outside of the chip to be tested through the test pad, so that through the test pin, the noise testing of at least one internal power supply corresponding to the same power supply type in the chip to be tested can be performed outside the chip to be tested, and the test accuracy of power supply noise can be improved.

Further, in some embodiments, the package substrate 40 is further disposed with a metal via and a metal trace. The test pad is electrically connected to the gold finger through the metal trace and the metal via, and the gold finger is electrically connected to the test pin by means of gold wire bonding, so that the test pad and the test pin are electrically connected together.

It should be noted that in the embodiment of the present disclosure, the selected test pad 411 on a backside of the package substrate 40 is connected, through the trace and the via, to the gold finger disposed on the surface of the package substrate 40, which is then connected to the test pin of the chip to be tested by means of gold wire bonding. In addition, other power supply pads on the backside of the package substrate 40 can also be connected, through traces and vias, to the gold finger disposed on the surface of the package substrate 40, which is then connected to other power supply pins of the chip to be tested by means of gold wire bonding, so as to realize the electric connection between the power supply pads of the package substrate 40 and the power supply pins of the chip to be tested.

Figure 6:
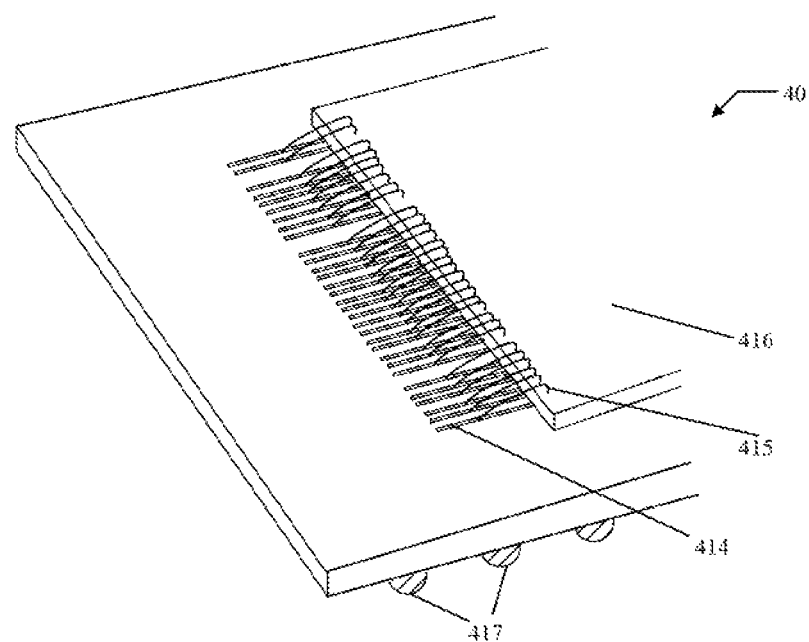
FIG. 6 is a diagram of a specific structure of a package substrate according to an embodiment of the present disclosure.

For example, referring to FIG. 6, FIG. 6 is a diagram of a specific structure of a package substrate 40 according to an embodiment of the present disclosure. As illustrated in FIG. 6, the package substrate 40 includes a gold finger 414, a gold wire 415, a chip to be tested 416 and pad arrays 417. It can be seen from FIG. 6 that the pad arrays 417 are disposed on the backside of the package substrate 40. Taking the test pad in the pad arrays 417 as an example, from the backside of the package substrate 40, the test pad is connected, through the trace and the via, to the gold finger 414 disposed on the surface of the package substrate 40, which is then connected to the test pin of the chip to be tested 416 through the gold wire 415, so as to realize the electric connection between the test pad and the test pin.

Further, in some embodiments, each of the multiple pad arrays at least includes a VDD1 power supply pad, a VDD2 power supply pad and a VDDQ power supply pad. The same power supply type is any one of the VDD1 power supply type, the VDD2 power supply type and the VDDQ power supply type.

It should be noted that in the embodiment of the present disclosure, there are three types of the power supply pads, such as VDD1 power supply pad(s), VDD2 power supply pad(s), and VDDQ power supply pad(s). Correspondingly, the same power supply type may be any one of the VDD1 power supply type, the VDD2 power supply type, and the VDDQ power supply type. For the three power supply types, the methods for testing power supply noise are similar. That is, for the VDD1 power supply type, a test pin is separated from other pins and is used for performing noise testing of the VDD1 power supply in the chip to be tested; for the VDD2 power supply type, a test pin is separated from other pins and is used for performing the noise testing of the VDD2 power supply in the chip to be tested; or for the VDDQ power supply type, a test pin is separated from other pins and is used for performing the noise testing of the VDDQ power supply in the chip to be tested.

In a specific embodiment, for the VDD1 power supply, power supply pads belonging to the VDD1 power supply type in the multiple pad arrays are divided into a VDD1 power supply test pad and a VDD1 power supply pad set. All VDD1 power supply pads in the power supply pad set are electrically connected to form a VDD1 power supply network, and the VDD1 power supply test pad is independent of the VDD1 power supply network. The VDD1 power supply test pad is configured to perform noise testing of the VDD1 power supply in the chip to be tested.

In another specific embodiment, for the VDD2 power supply, power supply pads belonging to the VDD2 power supply type in the multiple pad arrays are divided into a VDD2 power supply test pad and a VDD2 power supply pad set. All VDD2 power supply pads in the power supply pad set are electrically connected to form a VDD2 power supply network, and the VDD2 power supply test pad is independent of the VDD2 power supply network. The VDD2 power supply test pad is configured to perform noise testing of the VDD2 power supply in the chip to be tested.

In yet another specific embodiment, for the VDDQ power supply, power supply pads belonging to the VDDQ power supply type in the multiple pad arrays are divided into a VDDQ power supply test pad and a VDDQ power supply pad set. All VDDQ power supply pads in the power supply pad set are electrically connected to form a VDDQ power supply network, and the VDDQ power supply test pad is independent of the VDDQ power supply network. The VDDQ power supply test pad is configured to perform noise testing of the VDDQ power supply in the chip to be tested.

It should be noted that if the package substrate 40 includes power supply pads belonging to multiple power supply types, for each power supply type, the power supply pads can be divided into a corresponding test pad and a corresponding power supply pad set, and power supply pins in the chip to be tested can also be divided into a corresponding test pin and a corresponding power supply pin set. Then, all the power supply pads in the power supply pad set are electrically connected together by means of copper laying, so that all other power supply pins other than the test pin are electrically connected together. In this case, by leading out the test pin to the outside of the chip to be tested, not only the noise testing of the power supply with the power supply type in the chip to be tested is performed, but also the accuracy of testing the power supply noise is improved.

It should also be noted that in the embodiment of the present disclosure, the test pad for the VDD1 power supply is independent of the VDD1 power supply network, the test pad for the VDD2 power supply is independent of the VDD2 power supply network, the test pad for the VDDQ power supply is independent of the VDDQ power supply network. Moreover, the VDD1 power supply network, the VDD2 power supply network and VDDQ power supply network are also independent from each other.

It should also be noted that in the embodiment of the present disclosure, taking the VDDQ power supply as an example, if the test pad is named VDDQ1, the corresponding test pin in the chip to be tested can also be named VDDQ1, so as to better realize the electric connection between the test pin and the test pad on the package substrate.

An embodiment of the present disclosure provides a package substrate, the package substrate includes multiple pad arrays, and each of the multiple pad arrays at least includes power supply pads. Power supply pads belonging to a same power supply type in the multiple pad arrays are divided into a test pad and a power supply pad set. The power supply pad set includes power supply pads, other than the test pad, among the power supply pads belonging to the same power supply type, and all the power supply pads in the power supply pad set are electrically connected together. The test pad is configured to perform noise testing of at least one internal power supply corresponding to the same power supply type in a chip to be tested. In this way, although all the power supply pads in the power supply pad set are electrically connected together, the test pad is not electrically connected to the power supply pads in the power supply pad set. The separate test pad is used for performing noise testing of at least one internal power supply in the chip to be tested, so that situation of power supply noise in the chip can be accurately measured, thereby improving the accuracy of testing power supply noise.

Figure 7:
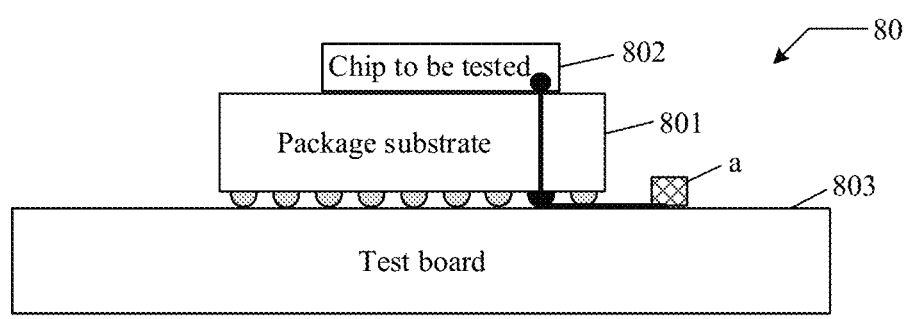
FIG. 7 is a diagram of a composition structure of an apparatus for testing power supply noise according to an embodiment of the present disclosure.

In another embodiment of the present disclosure, referring to FIG. 7, FIG. 7 is a diagram of a composition structure of an apparatus 80 for testing power supply noise according to an embodiment of the present disclosure. As illustrated in FIG. 7, the apparatus 80 for testing power supply noise includes a package substrate 801, a chip to be tested 802 and a test board 803.

The test board 803 is disposed with a first test point 'a' corresponding to the first power supply type.

The chip to be tested 802 at least includes power supply pins corresponding to the first power supply type, and the power supply pins are divided into a first test pin and a first power supply pin set excluding the first test pin.

The package substrate 801 at least includes power supply pads corresponding to the first power supply type, and the power supply pads are divided into a first test pad and a first power supply pad set excluding the first test pad.

Each of power supply pins in the first power supply pin set is electrically connected to a respective one of power supply pads in the first power supply pad set, the first test pin is electrically connected to the first test pad, and the first test pad is further electrically connected to the first test point, so that the first test point is capable of performing noise testing of at least one internal power supply corresponding to the first power supply type in the chip to be tested through the first test pad and the first test pin.

It should be noted that in this embodiment of the present disclosure, the package substrate 801 may be the package substrate 40 provided in the foregoing embodiments. In addition, the test board 803 may be a signal test single board or a system mainboard, which is not limited herein.

It should also be noted that in the embodiment of the present disclosure, in order to facilitate performing the power supply noise testing outside the chip, test points may be disposed on the test board 803. In the present disclosure, taking the first power supply type as an example, a corresponding first test point can be disposed on the test board 803, and then a power supply signal to be tested is led out through the first test point, so that the testing of the power supply noise in the chip to be tested can be performed outside the chip to be tested 802, and the test accuracy of the power supply noise is high.

It can be understood that in the embodiment of the present disclosure, since there may be multiple power supply types corresponding to the chip to be tested 802, and the first power supply type is only any one of the multiple power supply types, the number of test points on the test board 803 may also be multiple, and the number of test points is related to the number of power supply types. In other words, for different power supply types, different test points are disposed on the test board 803 correspondingly.

In some embodiments, the first power supply type may be any one of a VDD1 power supply type, a VDD2 power supply type, and a VDDQ power supply type. On the test board 803, different first test points are disposed for different first power supply types correspondingly.

Specifically, on the test board 803, a VDD1 test point corresponding to the VDD1 power supply type is disposed, a VDD2 test point corresponding to the VDD2 power supply type is disposed, and a VDDQ test point corresponding to the VDDQ power supply type is disposed. Then, the noise testing of a VDD1 power supply in the chip to be tested 802 can be realized through the VDD1 test point, the noise testing of a VDD2 power supply in the chip to be tested 802 can be realized through the VDD2 test point, and the noise testing of a VDDQ power supply in the chip to be tested 802 can be realized through the VDDQ test point.

In some embodiments, in the apparatus 80 for testing power supply noise, the chip to be tested 802, the package substrate 801 and the test board 803 are stacked in sequence.

It should be noted that referring specifically to FIG. 7, the chip to be tested 802 is disposed above the package substrate 801, and the test board 803 is disposed below the package substrate 801, thereby forming a laminated structure, which can not only save layout space, but also has a good overall aesthetics.

Figure 8:
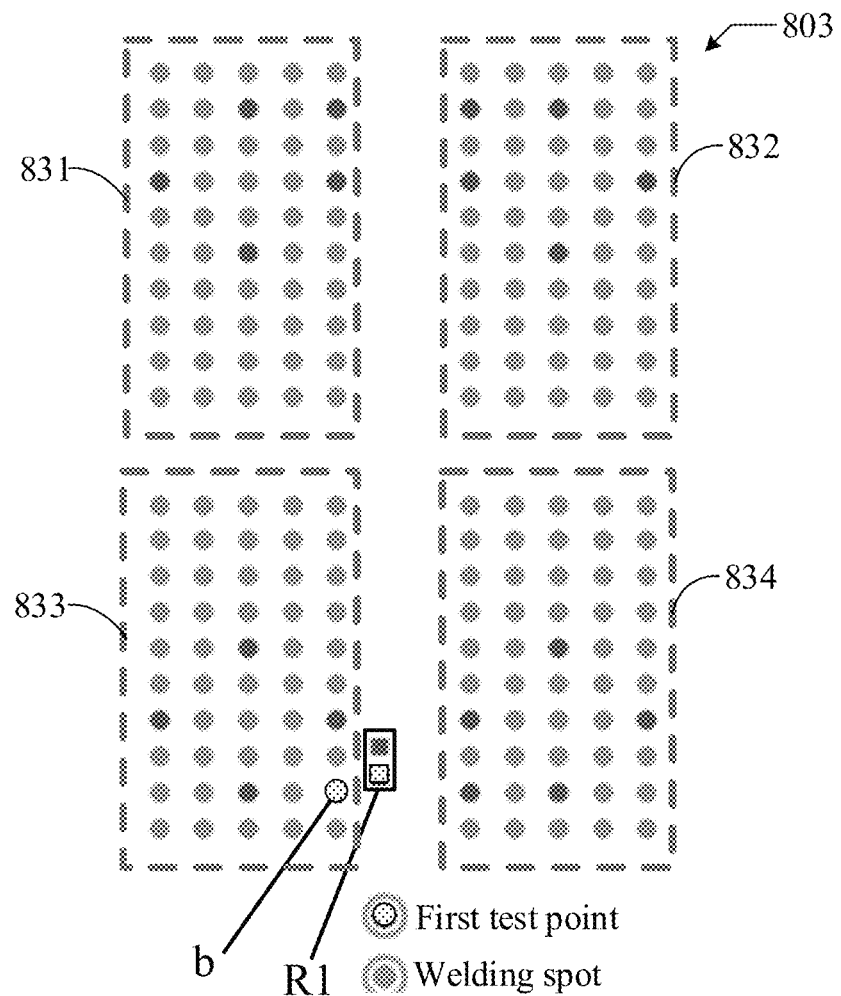
FIG. 8 is a diagram of a composition structure of another apparatus for testing power supply noise according to an embodiment of the present disclosure.

In some embodiments, referring to FIG. 8, the test board 803 may further be disposed with multiple welding spot arrays (e.g., a welding spot array 831, a welding spot array 832, a welding spot array 833 and a welding spot array 834) corresponding to the multiple pad arrays on the package substrate 801, and each of the multiple welding spot arrays at least includes power supply welding spots.

Power supply welding spots belonging to the first power supply type in the multiple welding spot arrays are divided into a first test welding spot 'b' and a first power supply welding spot set, each of power supply welding spots in the first power supply welding spot set is electrically connected to a respective one of the power supply pads in the first power supply pad set, and all the power supply welding spots in the first power supply welding spot set are electrically connected together to form a first power supply network. The first test welding spot 'b' is independent of the first power supply network.

It should be noted that in the embodiment of the present disclosure, referring to FIG. 8, the test board 803 includes the welding spot array 831, the welding spot array 832, the welding spot array 833 and the welding spot array 834. The four welding spot arrays may have a left-right symmetrical structure along the X-axis direction and an up-down symmetrical structure along the Y-axis direction.

It should also be noted that in the embodiment of the present disclosure, there are correspondences between the four welding spot arrays on the test board 803 and the four pad arrays on the package substrate 801, and each welding spot is electrically connected to the respective pad. In this way, taking the first power supply type as an example, the power supply pads belonging to the first power supply type on the package substrate 801 need to be divided to separate one power supply pad from other power supply pads, the separate power supply pad is taken as the first test pad and all other power supply pads are connected to form the first power supply network. Correspondingly, the power supply pins belonging to the first power supply type in the chip to be tested 802 also need to be divided to separate one power supply pin from other power supply pins, the separate power supply pin is taken as the first test pin, and each of all other power supply pins is electrically connected to a respective one of all other power supply pads, so that all the power supply pins excluding the first test pin are also electrically connected to the first power supply network, but the first test pin is not connected to the first power supply network. Correspondingly, the power supply welding spots belonging to the first power supply type on the test board 803 also need to be divided in the same way, to separate one power supply welding spot from other power supply welding spots, the separate power supply welding spot is taken as the first test welding spot, and then the first test pin is electrically connected to the first test point through the first test pad and the first test welding spot sequentially, so that the noise testing of at least one internal power supply corresponding to the first power supply type in the chip to be tested can be realized through the first test point outside the chip to be tested 802.

Further, in some embodiments, the test board 803 is further disposed with a first metal trace. The first test pad is connected to the first test welding spot, and the first test welding spot is electrically connected to the first test point through the first metal trace, so that the first test pad is electrically connected to the first test point.

It should be noted that in the embodiment of the present disclosure, referring to FIG. 7, a bold solid line on the test board 803 represents the first metal trace. It can be clearly seen from FIG. 7 that the first test pin is electrically connected to the first test welding spot through the first test pad on the package substrate 801, and then on the test board 803, the first test welding spot is electrically connected to the first test point 'a' through the metal trace, so as to realize the electric connection between the first test pin and the first test point. In this way, the power supply signal to be tested can be led out to the outside of the chip to be tested 802, so as to facilitate the noise testing of the power supply.

Further, in some embodiments, referring to FIG. 8, the test board 803 may further be disposed with a first resistor identifier R1, and the first resistor identifier R1 includes a first welding spot and a second welding spot. The first welding spot is connected to the first test welding spot, and the second welding spot is connected to the first power supply network.

In a specific implementation manner, in a testing mode, a first resistor is not welded at the first resistor identifier R1, so that the first test welding spot is disconnected from the first power supply network; in a working mode, the first resistor is welded at the first resistor identifier R1, so that the first test welding spot is in an electric connection state with the first power supply network.

It should be noted that in the embodiment of the present disclosure, still taking the first power supply type as an example, the first resistor identifier R1 corresponding to the first power supply type is disposed on the test board 803, and the first resistor identifier R1 is used to isolate the first test welding spot from the first power supply network. In the testing mode, the first test welding spot needs to be independent of the first power supply network, and in this case, the first resistor is not welded at the first resistor identifier R1, so that the first test welding spot is disconnected from the first power supply network. In the normal operation of the system, that is, the working mode, the first test welding spot also needs to be powered, and in this case, the first resistor needs to be welded at the first resistor identifier R1, so as to electrically connect the first test welding spot to the first power supply network. In this way, the connection or disconnection between the first test welding spot and the first power supply network can be realized based on whether the first resistor is welded at the first resistor identifier R1.

It should also be noted that in the embodiment of the present disclosure, a resistance value of the first resistor may be 0 ohms. In this way, the first resistor with the resistance value of 0 ohms is used to realize the electric connection between the first test welding spot and the first power supply network, energy loss on the first resistor can be avoided.

Further, in some embodiments, the first power supply type is any one of the VDD1 power supply type, the VDD2 power supply type and the VDDQ power supply type. On the test board 803, different first test points and different first resistor identifiers are disposed for different first power supply types.

In the embodiment of the present disclosure, since there may be multiple power supply types corresponding to the chip to be tested 802, and the first power supply type is only any one of the multiple power supply types, there may also be multiple resistor identifiers disposed on the test board 803, and the number of resistor identifiers is associated with the number of power supply types. In other words, for different power supply types, different resistor identifiers may be disposed on the test board 803.

Exemplarily, taking the VDDQ power supply type as an example, a VDDQ test pad on the package substrate 801 is separated from other VDDQ power supply pads and a corresponding VDDQ test pin in the chip to be tested 802 is separated from other VDDQ power supply pins, and then all other VDDQ power supply pins are connected together to form a VDDQ power supply network, and the VDDQ test pin is not connected to the VDDQ power supply network. However, when the test board 803 is powered, it is still necessary to supply power to the separate VDDQ test pin and the VDDQ power supply network together. Theoretically, there are many VDDQ power supply pins in the chip to be tested 802, and lack of one pin does not affect the normal operation. Actually, when no testing is performed, the VDDQ test pin is in an idle state, and the VDDQ test pin is powered through the first resistor. When testing is performed, the VDDQ test pin is not powered, and the VDDQ test pin is only used for noise testing of the VDDQ power supply in the chip to be tested 802.

Figure 9:
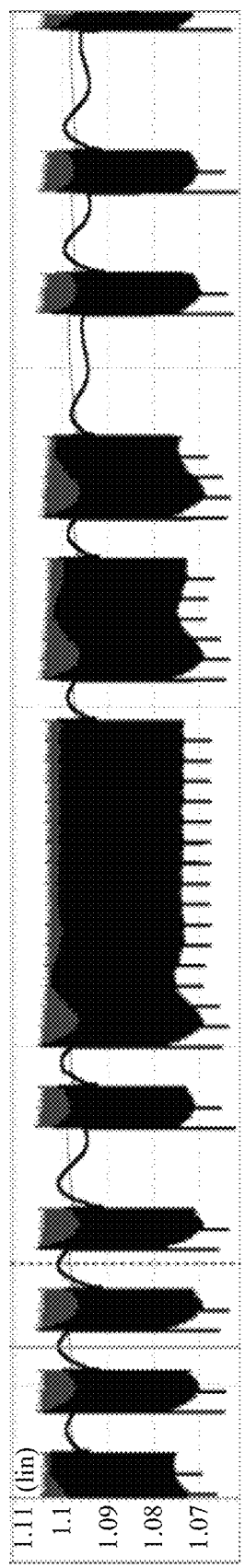
FIG. 9 is a diagram of a test result of power supply noise in a chip according to an embodiment of the present disclosure.

That is to say, in the embodiment of the present disclosure, if the first resistor of 0 ohms is welded at the first resistor identifier R1, the VDDQ test pin can be provided with the same power supply as that of the VDDQ power supply network. If the first resistor of 0 ohm is not welded at the first resistor identifier R1, it means that the VDDQ test pin is no longer powered, and in this case, other VDDQ power supply pins in the chip to be tested 802 are connected together, and the power supply signal to be tested can be led out through the VDDQ test pin and the test point on the test board 803, so that when the apparatus 80 for testing power supply noise is in the testing mode, based on the separate VDDQ test pin, an accurate test result of power supply noise in the chip to be tested can be obtained by direct measurement outside the chip to be tested 802. Exemplarily, FIG. 9 is a diagram of a test result of power supply noise in a chip according to an embodiment of the present disclosure. As illustrated in FIG. 9, the test result is obtained by measurement outside the chip to be tested 802, specifically, at the first test point. That is to say, a test platform is assembled according to the embodiment of the present disclosure, and then at least one internal power supply in the chip is tested through the first test point, so that the power supply noise of the Die(s) in the chip can be tested more accurately.

Embodiments of the present disclosure provide an apparatus for testing power supply noise. The apparatus for testing power supply noise relates to semiconductor memory technologies, and in particular to test verification of SDRAM. Specifically, a special package design is used, which can be more accurate in measurement of the power supply of the chip to be tested. Herein, the package substrate is disposed with the first test pad independent of the first power supply network, and the chip to be tested is correspondingly disposed with the first test pin independent of the first power supply network. Then, the package substrate and the chip to be tested are packaged to form a semiconductor structure, and the semiconductor structure is arranged on the test board. In this way, the first test pin independent of the first power supply network is electrically connected to the first test point on the test board through the first test pad, so that the power supply noise in the chip to be tested in the semiconductor structure can be tested through the first test point outside the chip to be tested, and the accuracy of testing the power supply noise is improved.

In yet another embodiment of the present disclosure, referring to FIG. 10, FIG. 10 is a flowchart of a method for testing power supply noise according to an embodiment of the present disclosure. As illustrated in FIG. 10, the method includes following operations.

At an operation S1001, in a testing mode, noise testing of at least one internal power supply corresponding to a first power supply type in a chip to be tested is performed through a first test point on a test board. The first test point has a corresponding relationship with the first power supply type, and the first power supply type is any one of a VDD1 power supply type, a VDD2 power supply type, and a VDDQ power supply type.

It should be noted that in the embodiment of the present disclosure, the method, which is applied to the apparatus for testing power supply noise described in the foregoing embodiments, can be regarded as a method for performing noise testing of an internal power supply in an SDRAM chip.

It should also be noted that in the embodiment of the present disclosure, the apparatus for testing power supply noise includes a test board, a package substrate, and a chip to be tested, and the chip to be tested, the package substrate, and the test board are stacked in sequence. In a specific embodiment, the test board is further disposed with multiple welding spot arrays corresponding to multiple pad arrays on the package substrate, and each of the multiple welding spot arrays at least includes power supply welding spots. Power supply welding spots belonging to the first power supply type in the multiple welding spot array are divided into a first test welding spot and a first power supply welding spot set, each of power supply welding spots in the first power supply welding spot set is electrically connected to a respective one of power supply pads in the first power supply pad set, and all the power supply welding spots in the first power supply welding spot set are electrically connected together to form a first power supply network. The first test welding spot is independent of the first power supply network.

In the embodiment of the present disclosure, there are corresponding relationships between multiple welding spot arrays on the test board and multiple pad arrays on the package substrate, and each welding spot is electrically connected to a respective pad. In this way, taking the first power supply type as an example, power supply pads belonging to the first power supply type on the package substrate need to be divided to separate one power supply pad from other power supply pads, the separate power supply pad is taken as the first test pad and all other power supply pads are connected to form the first power supply network. Correspondingly, power supply pins belonging to the first power supply type in the chip to be tested need to be divided to separate one power supply pin from other power supply pins, the separate power supply pin is taken as the first test pin and other power supply pins are electrically connected to the corresponding power supply pads, so that all the power supply pins except the first test pin are also electrically connected to the first power supply network, but the first test pin is not connected to the first power supply network. Correspondingly, power supply welding spots belonging to the first power supply type on the test board also need to be divided similarly to separate one power supply welding spot from other power supply welding spots, the separate power supply welding spot is taken as the first test welding spot, and then the first test pin is electrically connected to the first test point through the first test pad and the first test welding spot in sequence, so that the noise testing of at least one internal power supply corresponding to the first power supply type in the chip to be tested is realized through the first test point outside the chip to be tested.

Further, in some embodiments, the test board is further disposed with a first resistor identifier, and the method further includes following operations. In a working mode, it is determined that a first resistor is welded at the first resistor identifier, and the first test welding spot is controlled, through the first resistor, to be in an electric connection state with the first power supply network.

Further, in some embodiments, the method further includes following operations. In the testing mode, it is determined that the first resistor is not welded at the first resistor identifier, so that the first test welding spot is disconnected from the first power supply network.

In the embodiment of the present disclosure, a resistance value of the first resistor may be 0 ohms.

In the embodiment of the present disclosure, since there may be multiple power supply types corresponding to the chip to be tested (e.g., the VDD1 power supply type, the VDD2 power supply type, and the VDDQ power supply type), and the first power supply type is only any one of the multiple power supply types, there can also be multiple resistor identifiers disposed on the test board, and the number of resistor identifiers is related to the number of power supply types. In other words, different resistor identifiers are disposed on the test board for different power supply types.

Exemplarily, taking the first power supply type as an example, the first resistor identifier corresponding to the first power supply type is disposed on the test board, and the first resistor identifier is used to isolate the first test welding spot from the first power supply network. Herein, in the testing mode, the first test welding spot needs to be independent of the first power supply network, and in this case, the first resistor is not welded at the first resistor identifier, so that the first test welding spot is disconnected from the first power supply network. In a normal operation of a system, that is, in the working mode, the first test welding spot also needs to be powered, and in this case, the first resistor needs to be welded at the first resistor identifier, so that the first test welding spot is electrically connected to the first power supply network. In this way, the connection or disconnection between the first test welding spot and the first power supply network can be realized based on whether the first resistor is welded at the first resistor identifier, so that when in the testing mode, an accurate test result of power supply noise in the chip to be tested can be obtained by direct measurement outside the chip to be tested.

Embodiments of the present disclosure provide a method for testing power supply noise, and specifically provide a method for accurately measuring power supply noise in a chip by modifying a design of a package substrate. On the one hand, a network distribution of power supply pins is modified in the design of the package substrate. On the other hand, corresponding test points are added on a test board (for example, a system mainboard), in a testing mode, a first resistor of 0 ohms is removed or not welded, and then measurement of power supply noise in the chip is performed based on the test point for the corresponding power supply. In this way, according to technical solutions provided by the foregoing embodiments, in the testing mode, an accurate situation of the power supply noise in the chip can be measured directly by using the corresponding test point, so that the accuracy of testing power supply noise is improved.

The above embodiments are only preferred embodiments of the present disclosure, and are not intended to limit the protection scope of the present disclosure.

It should be noted that in the present disclosure, the terms "include", "including" or any other variation thereof are intended to encompass non-exclusive inclusion, such that a process, method, article or apparatus including a series of elements includes not only those elements, but also includes other elements not expressly listed or inherent to such a process, method, article or apparatus. Without further limitation, an element defined by the phrase "including a . . . " does not preclude the presence of additional identical elements in the process, method, article or apparatus that includes the element.

The above-mentioned serial numbers of the embodiments of the present disclosure are only for description, and do not represent the advantages or disadvantages of the embodiments.

The methods disclosed in the several method embodiments provided in the present disclosure can be combined arbitrarily without conflict to obtain new method embodiments.

The features disclosed in the several product embodiments provided in the present disclosure can be combined arbitrarily without conflict to obtain new product embodiments.

The features disclosed in several method or apparatus embodiments provided in the present disclosure can be combined arbitrarily without conflict to obtain new method embodiments or apparatus embodiments.

The above embodiments are only specific embodiments of the present disclosure, but the protection scope of the present disclosure is not limited thereto. Any person skilled in the art who is familiar with the technical scope of the present disclosure can easily think of changes or substitutions, which should fall within the scope of protection of the present disclosure. Therefore, the protection scope of the present disclosure should be subject to the protection scope of the claims.

INDUSTRIAL APPLICABILITY

According to the embodiments of the present disclosure, the apparatus for testing power supply noise may separate one pin from other pins on a package substrate and take the separate pin as a first test pin, and dispose a first test point on a test board, and then connect the first test pin to the first test point, so that not only a signal for testing power supply noise is led out through the first test point, but also the signal for testing is independent of a first power supply network corresponding to a first power supply type. In such a manner, noise testing of at least one internal power supply in the chip to be tested is performed through the first test point on the test board, which improves accuracy of testing the power supply noise.

The invention claimed is:

1. A package substrate, comprising a plurality of pad arrays, each of the plurality of pad arrays at least comprising power supply pads,
wherein power supply pads belonging to a same power supply type in the plurality of pad arrays are divided into a test pad and a power supply pad set, and
wherein the power supply pad set comprises power supply pads, other than the test pad, among the power supply pads belonging to the same power supply type, all the power supply pads in the power supply pad set being electrically connected together, and the test pad is configured to perform noise testing of at least one internal power supply corresponding to the same power supply type in a chip to be tested.

2. The package substrate of claim 1, wherein the package substrate comprises four pad arrays, and wherein the four pad arrays form an up-down symmetrical and left-right symmetrical structure.

3. The package substrate of claim 1, wherein the package substrate further comprises a conductive layer, and wherein in the conductive layer, the power supply pads in the power supply pad set are electrically connected by means of copper laying to form a first power supply network, and the test pad is independent of the first power supply network.

4. The package substrate of claim 1, wherein a surface of the package substrate is disposed with a gold finger, and wherein in the same power supply type, a distance between the test pad and the gold finger is less than a distance between each of the power supply pads in the power supply pad set and the gold finger.

5. The package substrate of claim 4, wherein the surface of the package substrate is further disposed with the chip to be tested, and the chip to be tested comprises a plurality of pin arrays, each of the plurality of pin arrays at least comprising power supply pins, wherein power supply pins belonging to the same power supply type in the plurality of pin arrays are divided into a test pin and a power supply pin set, and wherein each of power supply pins in the power supply pin set is electrically connected to a respective one of the power supply pads in the power supply pad set, and the test pin is electrically connected to the test pad, so that the test pad is capable of performing, through the test pin, the noise teasing of the internal power supply corresponding to the same power supply type in the chip to be tested.

6. The package substrate of claim 5, wherein the package substrate is further disposed with a metal via and a metal trace, and wherein the test pad is electrically connected to the gold finger through the metal trace and the metal via, and the gold finger is electrically connected to the test pin by means of gold wire bonding, so that the test pad and the test pin are electrically connected together.

7. The package substrate of claim 1, wherein each of the plurality of pad arrays at least comprises a VDD1 power supply pad, a VDD2 power supply pad and a VDDQ power supply pad, and wherein the same power supply type is any one of a VDD1 power supply type, a VDD2 power supply type and a VDDQ power supply type.

8. The package substrate of claim 7, wherein power supply pads belonging to the VDD1 power supply type in the plurality of pad arrays are divided into a VDD1 power supply test pad and a VDD1 power supply pad set, wherein all power supply pads in the VDD1 power supply pad set are electrically connected to form a VDD1 power supply network, the VDD1 power supply test pad is independent of the VDD1 power supply network, and the VDD1 power supply test pad is configured to perform noise testing of a VDD1 power supply in the chip to be tested;

power supply pads belonging to the VDD2 power supply type in the plurality of pad arrays are divided into a VDD2 power supply test pad and a VDD2 power supply pad set, wherein all power supply pads in the VDD2 power supply pad set are electrically connected to form a VDD2 power supply network, the VDD2 power supply test pad is independent of the VDD2 power supply network, and the VDD2 power supply test pad is configured to perform noise testing of a VDD2 power supply in the chip to be tested; and power supply pads belonging to the VDDQ power supply type in the plurality of pad arrays are divided into a VDDQ power supply test pad and a VDDQ power supply pad set, wherein all power supply pads in the VDDQ power supply pad set are electrically connected to form a VDDQ power supply network, the VDDQ power supply test pad is independent of the VDDQ power supply network, and the VDDQ power supply test pad is configured to perform noise testing of a VDDQ power supply in the chip to be tested.

9. An apparatus for testing power supply noise, comprising the package substrate according to claim 1, the chip to be tested, and a test board, wherein the test board is disposed with a first test point corresponding to a first power supply type;

the chip to be tested at least comprises power supply pins corresponding to the first power supply type, and the power supply pins are divided into a first test pin and a first power supply pin set excluding the first test pin; and the package substrate at least comprises power supply pads corresponding to the first power supply type, and the power supply pads are divided into a first test pad and a first power supply pad set excluding the first test pad, wherein each of power supply pins in the first power supply pin set is electrically connected to a respective one of power supply pads in the first power supply pad set, the first test pin is electrically connected to the first test pad, and the first test pad is further electrically connected to the first test point, so that the first test point is capable of performing, through the first test pad and the first test pin, noise testing of at least one internal power supply corresponding to the first power supply type in the chip to be tested.

10. The apparatus for testing power supply noise of claim 9, wherein the chip to be tested, the package substrate and the test board are stacked in sequence.

11. The apparatus for testing power supply noise of claim 9, wherein the test board is further disposed with a plurality of welding spot arrays corresponding to the plurality of pad arrays on the package substrate, and each of the plurality of welding spot arrays at least comprises power supply welding spots;

wherein power supply welding spots belonging to the first power supply type in the plurality of welding spot arrays are divided into a first test welding spot and a first power supply welding spot set, each of power supply welding spots in the first power supply welding spot set is electrically connected to a respective one of the power supply pads in the first power supply pad set, and all the power supply welding spots in the first power supply welding spot set are electrically connected together to form a first power supply network, and wherein the first test welding spot is independent of the first power supply network.

12. The apparatus for testing power supply noise of claim 11, wherein the test board is further disposed with a first metal trace, and
wherein the first test pad is connected to the first test welding spot, and
the first test welding spot is electrically connected to the first test point through the first metal trace, so that the first test pad is electrically connected to the first test point.

13. The apparatus for testing power supply noise of claim 11, wherein the test board is further disposed with a first resistor identifier, and the first resistor identifier comprises a first welding spot and a second welding spot, and
wherein the first welding spot is connected to the first test welding spot, and the second welding spot is connected to the first power supply network.

14. The apparatus for testing power supply noise of claim 13, wherein
in a testing mode, a first resistor is not welded at the first resistor identifier, so that the first test welding spot is disconnected from the first power supply network; and
in a working mode, the first resistor is welded at the first resistor identifier, so that the first test welding spot is electrically connected to the first power supply network.

15. The apparatus for testing power supply noise of claim 14, wherein a resistance value of the first resistor is 0 ohms.

16. The apparatus for testing power supply noise of claim 13, wherein the first power supply type is any one of a VDD1 power supply type, a VDD2 power supply type and a VDDQ power supply type, and
wherein, for different first power supply types, different first test points and different first resistor identifiers are disposed on the test board.

17. A method for testing power supply noise, applied to the apparatus for testing power supply noise of claim 9, the method comprising:
in a testing mode, performing, through the first test point on the test board, noise testing of the at least one internal power supply corresponding to the first power supply type in the chip to be tested,
wherein the first test point has a corresponding relationship with the first power supply type, and the first power supply type is any one of a VDD1 power supply type, a VDD2 power supply type, and a VDDQ power supply type.

18. The method of claim 17, wherein the test board is further disposed with a plurality of welding spot arrays corresponding to a plurality of pad arrays on the package substrate, and each of the plurality of welding spot arrays at least comprises power supply welding spots,
wherein power supply welding spots belonging to the first power supply type in the plurality of welding spot arrays are divided into a first test welding spot and a first power supply welding spot set, each of power supply welding spots in the first power supply welding spot set is electrically connected to a respective one of the power supply pads in the first power supply pad set, and all the power supply welding spots in the first power supply welding spot set are electrically connected together to form a first power supply network, and wherein the first test welding spot is independent of the first power supply network.

19. The method of claim 18, wherein the test board is further disposed with a first resistor identifier, and the method further comprises:
in a working mode, determining that a first resistor is welded at the first resistor identifier, and controlling, through the first resistor, the first test welding spot to be electrically connected to the first power supply network.

20. The method of claim 19, further comprising:
in the testing mode, determining that the first resistor is not welded at the first resistor identifier, so that the first test welding spot is disconnected from the first power supply network.

* * * * *